United States Patent [19]

Ward

[11] Patent Number: 4,770,713

[45] Date of Patent: Sep. 13, 1988

[54] STRIPPING COMPOSITIONS CONTAINING AN ALKYLAMIDE AND AN ALKANOLAMINE AND USE THEREOF

[75] Inventor: Irl E. Ward, Hatfield, Pa.

[73] Assignee: Advanced Chemical Technologies, Inc., Bethlehem, Pa.

[21] Appl. No.: 158,316

[22] Filed: Feb. 22, 1988

Related U.S. Application Data

[63] Continuation-in-part of Ser. No. 940,098, Dec. 10, 1986, abandoned.

[51] Int. Cl.$^4$ .......................... B08B 7/00; C09D 9/00; C11D 3/44; C23D 17/00
[52] U.S. Cl. ...................................... 134/38; 252/153; 252/171; 252/174.21; 252/544; 252/548; 252/DIG. 1; 252/DIG. 8; 430/260; 430/329
[58] Field of Search .......... 252/153, 170, 171, 174.21, 252/544, 548, DIG. 1, DIG. 8; 134/38; 430/260, 329

[56] References Cited

U.S. PATENT DOCUMENTS

| | | | |
|---|---|---|---|
| 1,829,583 | 10/1931 | Davidson | 252/DIG. 8 |
| 2,750,343 | 6/1956 | Beber | 252/153 |
| 3,324,039 | 6/1967 | Rosenfeld | 252/153 |
| 3,784,477 | 1/1974 | Esposito | 252/162 |
| 3,806,465 | 4/1974 | Karl | 252/316 |
| 3,997,360 | 12/1976 | Testa | 134/22 R |
| 4,276,186 | 6/1981 | Bakos | 252/158 |
| 4,403,029 | 9/1983 | Ward | 430/258 |
| 4,617,251 | 10/1986 | Sizensky | 430/256 |

FOREIGN PATENT DOCUMENTS

2425206 12/1975 Fed. Rep. of Germany ...... 252/544
818331 8/1959 United Kingdom ......... 252/DIG. 8

Primary Examiner—Dennis Albrecht
Attorney, Agent, or Firm—Steele, Gould & Fried

[57] ABSTRACT

Stripping compositions for removing paints, varnishes, enamels, photoresists and the like, from substrates comprising compositions of (a) an amide compound of the formula:

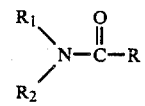

and mixtures thereof wherein R is a member selected from the group consisting of methyl, ethyl and propyl; $R_1$ is a member selected from the group consisting of hydrogen, methyl, ethyl and propyl, and $R_2$ is a member selected from the group consisting of methyl, ethyl and propyl, and (b) an amine compound of the formula:

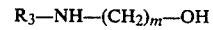

and mixtures thereof, wherein $R_3$ is a member selected from the group consisting of hydrogen, methyl, ethyl and propyl, and m is an integer of 1–4.

17 Claims, No Drawings

STRIPPING COMPOSITIONS CONTAINING AN ALKYLAMIDE AND AN ALKANOLAMINE AND USE THEREOF

This application is a continuation-in-part of application Ser. No. 940,098 filed Dec. 10, 1986, now abandoned.

BACKGROUND OF THE INVENTION

1. Field Of The Invention

This invention relates to stripping compositions particularly useful for stripping paints, varnishes, enamels, photoresists and the like, from various substrates such as, for example, from wood or metal substrates. This invention also relates to the use of such stripping compositions to strip paint, varnishes, enaamels, photoresists and the like, from various substrates.

2. Description Of The Prior Art

Stripping compositions used for removing coatings from substrates have for the most part been highly flammable compositions, compositions generally hazardous to both humans and the environment and compositions which are reactive solvent mixtures evidencing an undesirable degree of toxicity. Moreover, these stripping compositions are not only toxic but their disposal is costly since they must be disposed of as a hazardous waste. In addition, these stripping compositions generally have severely limited bath life and, for the most part, are not recyclable or reusable.

Generally, compositions containing chlorinated hydrocarbons and/or phenolic compounds or other highly caustic and corrosive materials have been employed as stripping compositions for stripping paints, varnishes, lacquers, enamels, photoresists, powder coatings and the like, from substrates such as wood or metal. Hot caustic compositions are generally employed to remove coatings from metals and methylene chloride compositions to remove coatings from wood. In many cases, the components of the stripping compositions are relatively toxic reactive solvent mixtures and thus must be subject to stringent use conditions and require hazardous chemical handling procedures and wearing of safety garments and apparel by users so as to avoid contact with the stripping compositions.

Additionally, because many of the toxic components of such stripping compositions are highly volatile and subject to unduly high evaporation rates, the stripping compositions require special human and environmental safety precautions to be taken during storage and use of said compositions.

U.S. Pat. No. 4,276,186 to Bakos et al discloses a cleaning composition which includes N-methyl-2-pyrrolidone and an alkanolamine. However, in a comparative study, applicant has found that the use of N-methyl-2-pyrrolidone does not provide a broad spectrum of cleaning as is capable with the composition of the invention.

U.S. Pat. No. 4,617,251 to Sizensky discloses a stripping composition which is prepared with a select amine and an organic polar solvent. The composition is formed utilizing from about 2 to about 98% by weight of amine compound and about 98 to about 2% of an organic polar solvent. There is specifically disclosed a composition prepared with diethanolamine and N,N-dimethylacrylamide in a percent ratio of 60/40. The applicant has discovered that in order to obtain a stripping composition which have a broad spectrum of cleaning capabilities for resist-coated substrates, the use of N-methylalkanols which are straight chained together with specific amides in which the amide is present in the amount of 85 to about 99% by weight, is required.

Recently, OSHA, EPA and other similar federal, state and local governmental regulatory agencies have advocated a shift toward use of more human and environmentally compatible stripping compositions and stripping methods that are not subject to the aforementioned drawbacks and problems.

Moreover, heretofore available stripping compositions have required unduly long residence times or repeated applications in order to remove certain coatings. In addition, various coatings have resisted removal from certain substrates with these heretofore available stripping compositions. That is, these previously available stripping compositions have not provided adequate or complete removal of certain hard-to-remove coatings from various substrates.

It is, therefore, highly desirable to provide stripping compositions that exhibit substantially no human or environmental toxicity, are water miscible and are biodegradable. It is also desirable to provide stripping compositions that are substantially non-flammable, non-corrosive, evidence relatively little, if any, tendency to evaporate and are generally unreactive and also of little toxicity to humans and are environmentally compatible. It would also be most desirable to provide stripping compositions that are recyclable, if desired, and thus available for extended bath life and multiple use. It is also desirable that stripping compositions be provided that permit the stripped coatings to be collected and removed as solids for easy disposal.

Moreover, it would be desirable to provide stripping compositions that have a high degree of stripping efficacy and particularly such high degree of stripping efficacy at lower temperatures than generally required with prior stripping compositions.

It is also highly desirable that stripping compositions be provided that exhibit very low vapor pressure at elevated temperatures, thereby significantly reducing evaporation and thus contamination of the atmosphere.

Additionally, it is highly desirable that such stripping compositions be provided that are effective and efficient stripping compositions for removal of coatings from substrates that heretofore have resisted ready removal with conventionally available strippers.

It is also desirable that effective stripping compositions be provided that are devoid of undesirable chlorinated or phenolic components and which do not require the use of hot caustic components. Highly desirable are stripping compositions and use thereof that are not considered undesirable by regulatory agencies overseeing their production and use.

It is also most advantageous that stripping compositions be provided with the above-identified desirable characteristics which evidence synergistic stripping action in that the mixtures of components provide stripping efficacy and stripping results not always obtainable with the individual components.

SUMMARY OF THE INVENTION

It has now been found that a suitable stripping composition in which the hereinbefore mentioned disadvantages or drawbacks are eliminated or substantially reduced and in which the range of usefulness of the stripping compositions is greatly extended can be obtained in accordance with the teachings of the present invention.

The novel stripping compositions of this invention comprise a mixture of:

(a) from about 85% to about 99% by weight of an amide compound of the formula:

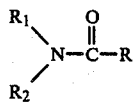   (Formula I)

and mixtures thereof, wherein R is a member selected from the group consisting of methyl, ethyl and propyl; R₁ is selected from the group consisting of hydrogen, methyl, ethyl and propyl, and R₂ is a member selected from the group consisting of methyl ethyl and propyl; and (b) from about 1% to about 15% by weight an amine compound of the formula:

R₃—NH—(CH₂)—OH   (Formula II)

and mixtures thereof, wherein R₃ is a member selected from the group consisting of hydrogen, methyl, ethyl and propyl, and m is an integer of 1 to 4.

Advantageously, up to about 2.0% by weight of a nonionic surfactant is added to the composition.

The novel stripping compositions of this invention exhibit synergistically enhanced stripping action and provide stripping capabilities not possible from the use of the individual components used alone as strippers for coatings from various substrates.

DETAILED DESCRIPTION OF THE INVENTION

The stripping compositions of this invention comprises from about 85 to about 99%, preferably, from about 92 to about 99%, by weight of an amide or mixture of such amides of Formula I, and from about 1 to about 15%, preferably from about 1 to about 8%, of an amine compound or mixture of such amines of Formula II. It is desirable to include in the compositions a nonionic surfact in an amount up to about 2% by weight, preferably about 0.2% by weight.

As examples of suitable amide compounds of Formula I useful in the compositions of this invention, there may be mentioned, for example, N,N-dimethyl acetamide, N-methyl acetamide, N,N-diethyl acetamide, N,N-dipropyl acetamide, N,N-dimethyl propionamide, N,N-diethyl butyramide and N-methyl-N-ethyl propionamide. Particularly preferred are N,N-dimethyl acetamide and N-methyl-N-ethyl acetamide.

As examples of amine compounds of Formula II useful in the compositions of this invention, there may be mentioned, for example, monoethanolamine, monopropanolamine, methylaminoethanol, etc.

Preferred stripping compositions of this invention comprise from about 94 to about 99% by weight N,N-dimethyl acetamide or N-methyl-N-ethylacrylamide and from about 1 to about 6%, by weight, monoethanolamine or monopropanolamine.

Especially preferred stripping compositions of this invention comprise a mixture comprising about 94% by weight N,N-dimethylacetamide or N-methyl-N-ethyl acetamide and about 6% by weight monoethanolamine.

As exemplary stripping compositions of this inventions there can be mentioned the following compositions of Table I.

TABLE I

| Component | Percent by Weight Composition | | | | | |
|---|---|---|---|---|---|---|
| | A | B | C | D | E | F |
| Diethyl acetamide | | 97.2 | | 96 | | |
| Dimethyl acetamide | 99 | | 75 | | 85 | 96 |
| N—methyl-N—ethyl acetamide | | | 20 | | | |
| Monoethanolamine | 1 | 2.8 | 5 | | | 4 |
| Monoethanolamine | | | | 4 | 15 | |

The stripping compositions of this invention may also contain, if desired, any suitable water miscible nonionic detergent which does not adversely affect the stripping action of the compositions of this invention, generally in an amount of about 0.1 to about 2% by weight of the total composition.

The nonionic detergents which may be utilized can be of the three basic types—the alkylene oxide condensates, the amides and the semi-polar nonionics. Preferably, the nonionic detergent is an ethoxylated alkylphenol or alkylphenoxypoly(ethyleneoxy)ethanol, an ethoxylated aliphatic alcohol; polyoxyethylene, a carboxylic ester like a glycerol ester (mono- or di-), and other equivalent nonionic surfactants. Typical suitable ethoxylated alkylphenols are alkylphenols of C₈ to C₁₂ alkyphenols. It is most preferred that they be water soluble, those having at least 60 weight percent of polyoxyethylene groups being particularly well suited. Such ethoxylated alkylphenols are well known under various trademarks such as Igepal of GAF Corporation, Levelene, Neutronyx, Solar NP, the Surfonic series, and the Triton N and X series marketed by Rohm and Haas Co., just to name a few.

Among the polyoxyethylenes suitable for use in accordance with the invention are the mono- and dialkyl ethers of ethylene glycols and their derivatives. Typical of other nonionics are the monobutyl ether, ethylene glycol monobutyl ether acetate, ethylene glycol monoethyl ether acetate, ethylene glycol dibutyl ether, ethylene glycol monohexyl ether, ethylene glycol monomethyl ether, ethylene glycol monomethyl ether acetate, ethylene glycol monophenyl ether and other equivalent ethers of ethylene glycol. Another group of nonionics are the polyethylene glycols and the alkoxy derivatives, particularly lower alkoxy, such as methoxy polyethylene glycol; also diethylene glycols, propylene glocol and other similar glycols.

Preferred nonionics, by example, are Igepal DM 710 and CO-610 (GAF Corp.); Pluradot HA430, Plurafac RA-30 and -43, Pluronic L-62 and L-10 (BASF Wyandotte Co.); Poly-Tergent LF-405 and SLF-18 and SLF-45 (Olin Co.); Sandoxylate SX series (Sandoz Co.); Emulphogene BC series (GAF Corp.).

Other suitable nonionic surfactants for use in the invention are disclosed in Kirk & Othmer, *Encyclopedia of Chemical Technology*, Vol. 19, pages 531 to 554, entitled "Nonionic Surfactants", which is incorporated herein by reference.

The stripping compositions of this invention are effective in stripping a wide and varied range of paints, enamels, lacquers, varnish, urethane coatings, powder and photoresist coatings and the like from various substrates such as wood or metal. As examples of wood or metal coatings that are stripped with the stripping compositions of this invention there may be mentioned, for examples, the following type coatings: linseed oil modified polyurethanes, white shellac, nitrocellulose coconut oil alkyds, acrylic modified alkyds, vinyl acetate/styrene/acrylic resins, tall oil-soya alkyds, soya-tung oil polyurethanes, tall oil linseed alkyds, epoxy paint, modified opoxy-ester resin paints, oil based enamels, alkyd enamels, marine varnishes, marine semi-gloss oil bases, latex enamels, lacquers, vinyl/acrylic resins, acrylic latexes, acrylic resins, phenolic resins and novolac/resole resins. The stripping compositions are also especially useful for stripping multiple layers of auto, airplane and metal enamels from metal substrates and are able to do so in a shorter time period and at a lower temperature than those previously used in commercial stripping compositions and methods.

The stripping compositions of this invention are especially useful and advantageous for numerous reasons among which may be mentioned the following. The stripping compositions are water miscible, non-corrosive, non-flammable and of low toxicity to humans and the environment. Because of the low ambient vapor pressure of the compositions they evidence substantially less evaporation than prior compositions and are non-reactive and environmentally compatible. The stripping compositions may be recycled for multiple use or easily disposed of in an environmentally safe manner without the necessity for burdensome safety precautions. Likewise, the stripped coatings may be readily removed as solids and collected for easy disposl. The stripping compositions of this invention evidence higher stripping efficiency at lower temperatures for a wide variety of coatings and substrates. Moreover, the stripping compositions are easily prepared by simply mixing the components at room temperature and thus require no special human or environmental safety precautions. Coatings not readily removed with previously available stripping compositions are readily and easily stripped with the stripping compositions of this invention. Furthermore, the components of the stripping compositions of this invention provide synergistic stripping action and permit readily and substantially complete removal of coatings from substrates that are not readily or completely removed by the individual components.

The effectiveness and unexpected nature of the stripping compositions of this invention is illustrated, but not limited, by the data presented in the following examples.

EXAMPLE 1

A single coat of semi-gloss oil based enamel (white) from Cook and Dunn Paint Corporation, Newark, N.J., was brushed onto test samples of birch wood at a temperature of about 21°–25° C. and permitted to cure/dry for a period of four weeks at this temperature. The wood test samples all evidenced good water absorption properties prior to painting. Following the cure/dry steps, the test samples were subjected to stripping by brushing equivalent amounts of various stripping compositions on the painted test samples using a paint brush and resting the samples set for a specified period of time without disturbance. A soft cloth rag was then wetted with the stripping composition and an attempt at finish removal was made by rubbing the test sample with the wetted rag.

Stripping compositions consisting solely of dimethyl acetamide or monoethanolamine, individually, each removed less than 50% of the semi-gloss oil based enamel coating following a residence time of stripping composition on the painted test samples of at least 8 minutes. In contradistinction, stripping compositions of this invention, identified as Compositions A and F of Table I hereinbefore, removed at least 95% of the semi-gloss oil based enamel coating after a residence time of 5 minutes and at least 100% after a residence time of 6½ minutes, respectively.

The test samples stripped with the compositions of this invention evidenced much better water absorption properties after stripping than the test samples stripped with the individual components.

EXAMPLE 2

Two coats of Man-O-War Ultra Spar Marine Varnish, from McCloskey Varnish Company, were brushed onto test samples of birch wood at a temperature of about 21°–25° C. and permitted to cure/dry for a period of four weeks at said temperature. The wood test samples all evidenced good water absorption properties prior to painting. Following the cure/dry step, the test samples were subjected to stripping by brushing equivalent amounts of various stripping compositions on the painted test samples using a paint brush and letting the samples set for a specified period of time without disturbance. A soft cloth rag was then wetted with the stripping composition and an attempt at finish removal was made by rubbing the test sample with the wetted rag.

Stripping compositions consisting solely of dimethyl acetamide or monoethanolamine, individually, each removed less than 50% of the marine varnish coatings following a residence time of stripping composition on the painted test samples of at least 8 minutes. In contradistinction, stripping compositions of this invention, identified as Compositions B and F of Table I, hereinbefore, removed at least 100% of the marine varnish coatings after a residence time of 3 minutes and at least 100% after a residence time of 2½ minutes, respectively.

The test samples stripped with the compositions of this invention evidenced much better water absorption properties after stripping than the test samples stripped with the individual components.

EXAMPLE 3

A single coat of tall-soya alkyd resin plus 25.5% drier with mineral spirits solvent system (Glidden Spread Lustre semi-gloss enamel) was brushed onto test samples of birch wood at a temperature of about 21°–25° C. and permitted to cure/dry for a period of four weeks at said temperature. The wood test samples all evidenced good water absorption properties prior to painting. Following the cure/dry step the test samples were subjected to stripping by brushing equivalent amounts of various stripping compositions on the painted test samples using a paint brush and letting the samples set for a specified period of time without disturbance. A soft cloth rag was then wetted with the stripping composition and an attempt at finish removal was made by rubbing the test sample with the wetted rag.

Stripping compositions consisting solely of dimethyl acetamide or monoethanolamine, individually, each removed less than 75% of the tall-soya alkyd resin following a residence time of stripping composition on the painted test samples of at least 15 minutes. In contradistinction, stripping compositions of this invention, identified as Compositions B and F of Table I, hereinbefore, removed at least 85% of the tall-soya alkyd resin after a residence time of 7 minutes and at least 90% after a residence time of 6 minutes, respectively.

The test samples stripped with the compositions of this invention evidenced much better water absorption properties after stripping than the test samples stripped with the individual components.

EXAMPLE 4

A steel bar with 37 layers of sequential heat and air cured automobile and metal enamels is stripped completely at 65° C. in under 40 minutes by stripping compositions A and F of Table I, hereinbefore. Presently, stripping of steel bars with such 37 coatings required anywhere from 8 to 24 hours in solvent enhanced hot caustic at a temperature of about 110°–120° C.

EXAMPLE 5

In order to demonstrate the efficiency of the different solvent compositions as positive photoresist strippers, the following tests were performed.

Metal substrates containing commercial photoresists were post-baked. The substrates were cooled and dipped into a vessel containing a stripping composition maintained at 75° C. and stirred with a magnetic stirrer. The contact time with the compositions was 5 minutes. The substrate was removed and dipped into a vessel containing water maintained at 25° C. and then rinsed with water. The results were as follows:

| Test No. | Stripping Composition % | Photoresist | Post Bake/ 60 min. °C. | Stripping Results |
|---|---|---|---|---|
| A | dimethylacetamide (DMA) (100) | AZ-1350 | 150 | <10% |
| B | N—methylpyrrolidone (NMP) (100) | EK-820 | 150 | <50% |
|  |  | OFPR-800 | 150 | <100% |
|  |  | AZ-4330 | 150 | 0 |
|  |  | AZ-1350J | 150 | <50% |
| C | NMP monoethanolamine (MEA) (94/6) | OFPR-800 | 200 | 0 |
|  |  | AZ-4330 | 200 | 0 |
| D | DMA/MEA (94/6) | AZ-4330 | 200 | 100% |

The tests demonstrate that DMA of the present invention and NMP as taught by the aforementioned U.S. Pat. No. 4,276,186 when used alone did not provide the stripping capabilities formed with the compositions of the present invention. Also, it is not possible to substitute NMP for DMA to produce as an effective composition as provided by this invention.

EXAMPLE 6

The conditions for stripping were followed according to Example 5 except that the stripping composition was maintained at 75° C. and the contact with the photoresist was for 3 minutes so that the conditions would fall within the ranges set forth at column 5, lines 37–56 of U.S. Pat. No. 4,276,186. The results were as follows:

| Test No. | Stripping Composition % | Photoresist | Post Bake/ 60 min. °C. | Stripping Results |
|---|---|---|---|---|
| E | NMP/MEA (94/6) | EK-820 | 200 | 0 |
| F | dimethylformamide (DMF)/MEA (94/6) | EK-820 | 180 | <100% |
|  |  | AZ-4330 | 180 | <100% |
|  |  | AZ-1350J | 200 | <100% |
| G | DMA/MEA (94/6) | EK-820 | 200 | 100% |
|  |  | AZ-4330 | 200 | 100% |
|  |  | AZ-1350J | 200 | 100% |

The composition of the invention was found to be more effective for use with different photoresists.

EXAMPLE 7

Following the procedure of Example 5, tests were performed as follows:

| Test No. | Stripping Composition % | Photoresist | Post Bake/ 60 min. °C. | Stripping Results |
|---|---|---|---|---|
| H | DMA/isopropanolamine (94/6) | A2-1350J | 180 | <100% |
|  |  | EK-820 | 180 | <100% |
|  |  | AZ-4330 | 200 | 0 |
|  |  | OFPR-800 | 200 | 0 |
| I | DMA/DEA (40/60) | AZ-1350J | 180 | <100% |
|  |  | EK-820 | 180 | 0 |
|  |  | AZ-4330 | 180 | ~60% |
|  |  | OFPR-800 | 180 | 0 |
| J | DMA/DEA (94/6) | AZ-1350J | 180 | 100% |
|  |  | EK-820 | 180 | 100% |
|  |  | AZ-4330 | 180 | 100% |
|  |  | OFPR-800 | 180 | 100% |

The tests indicate that branch chained amines are not as effective as the straight chained aliphatic amines and that the proportion of DMA to DEA in the composition is critical for good stripping.

EXAMPLE 8

Following the procedure of Example 5 except that the post-bake of the photoresist was for 30 minutes, the following tests were performed.

| Test No. | Stripping Composition % | Photoresist | Post Bake/ 60 min. °C. | Stripping Results |
|---|---|---|---|---|
| K | DMA/DEA* (40/60) | AZ-1350J | 200 | ~60% |
|  |  | EK-820 | 200 | <25% |
|  |  | OFPR-800 | 200 | <100% |
|  |  | AZ-4330 | 200 | <30% |
| L | DMA/MEA (85/15) | EK-820 | 180 | <100% |
|  |  | AZ-4330 | 180 | <100% |
|  |  | AZ-4330 | 200 | 0 |
| M | DMA/MEA (94/6) | EK-820 | 180 | 100% |
|  |  | AZ-4330 | 180 | 100% |
|  |  | AZ-4330 | 200 | 100% |

*The composition of Example 17 of U.S. Pat. No. 4,617,251

The composition of the invention was more effective when used within the proposed ratio of ingredients.

While the use of the hereinbefore recited stripping compositions of this invention has been described in connection with certain specific coatings and substrates for purposes of illustration, it will be appreciated that the stripping compositions of this invention are suitable for other stripping uses which will be apparent to those skilled in the art and can be employed with a variety of coatings on a variety of substrates in a variety of environments and industries.

What is claimed is:

1. A stripping composition comprising a mixture of:
   (a) from about 85% to about 99% by weight of an amide compound of the formula:

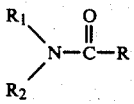

and mixtures thereof, wherein R is a member selected from the group consisting of methyl, ethyl and propyl; $R_1$ is selected from the group consisting of hydrogen, methyl, ethyl and propyl, and $R_2$ is a member selected from the group consisting of methyl, ethyl, and propyl; and (b) from about 1% to about 15% by weight an amine compound of the formula:

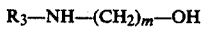

and mixtures thereof, wherein $R_3$ is a member selected from the group consisting of hydrogen, methyl, ethyl and propyl, and m is integer of 1 to 4.

2. A stripping composition of claim 1 wherein the amide compound comprises from about 90 to about 96% by weight.

3. A stripping composition of claim 1 wherein the amide compound comprises from about 94 to about 99% by weight and the amine compound comprises from about 1 to about 6% by weight.

4. A stripping composition of claim 1 including up to about 2% by weight of a nonionic detergent.

5. A stripping composition of claim 1 wherein the amide compound is N,N-dimethylacetamide.

6. A stripping composition of claim 5 wherein the amide compound is monoethanolamine.

7. A stripping composition of claim 6 including about 0.1 to about 1% by weight of a nonionic surfactant.

8. A stripping composition of claim 3 wherein the amide component is dimethyl acetamide and the amine component is selected from the group consisting of monopropanolamine and monoethanolamine.

9. A stripping composition of claim 8 comprising about 99% dimethyl acetamide and about 1% diethanolamine.

10. A stripping composition of claim 8 comprising about 96% dimethyl acetamide and about 4% monoethanolamine.

11. A process for removing a coating from a coated substrate comprising applying to said coated substrate a stripping effective amount of a stripping composition of claim 1, permitting said stripping composition to reside on said coated substrate for a stripping effective period of time and removing the coating from the substrate.

12. A process for removing a coating from a coated substrate comprising applying to said coated substrate a stripping effective amount of a stripping composition of claim 2, permitting said stripping composition to reside on said coated substrate for a stripping effective period of time and removing the coating from the substrate.

13. A process for removing a coating from a coating substrate comprising applying to said coated substrate a stripping effective amount of a stripping composition of claim 3, permitting said stripping composition to reside on said coated substrate for a stripping effective period of time and removing the coating from the substrate.

14. A process for removing a coating from a coated substrate comprising applying to said coated substrate a stripping effective amount of a stripping composition of claim 4, permitting said stripping composition to reside on said coated substrate for a stripping effective period of time and removing the coating from the substrate.

15. A process for removing a coating from a coated substrate comprising applying to said coated substrate a stripping effective amount of a stripping composition of claim 5, permitting said stripping composition to reside on said coated substrate for a stripping effective period of time and removing the coating from the substrate.

16. A process for removing a coating from a coated substrate comprising applying to said coated substrate a stripping effective amount of a stripping composition of claim 6, permitting said stripping composition to reside on said coated substrate for a stripping effective period of time and removing the coating from the substrate.

17. A process for removing a coating from a coated substrate comprising applying to said coated substrate a stripping effective amount of a stripping composition of claim 7, permitting said stripping composition to reside on said coated substrate for a stripping effective period of time and removing the coating from the substrate.

* * * * *